United States Patent
Kothandaraman et al.

(10) Patent No.: US 6,368,902 B1
(45) Date of Patent: Apr. 9, 2002

(54) ENHANCED EFUSES BY THE LOCAL DEGRADATION OF THE FUSE LINK

(75) Inventors: Chandrasekharan Kothandaraman, Wappingers Falls; Frank Grellner, Fishkill; Sundar Kumar Iyer, Beacon, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/580,132

(22) Filed: May 30, 2000

(51) Int. Cl.⁷ ............................................. H01L 21/82
(52) U.S. Cl. .................... 438/132; 438/131; 257/529; 257/530
(58) Field of Search ................................ 438/132, 131; 257/529, 530

(56) References Cited

U.S. PATENT DOCUMENTS

| | | | |
|---|---|---|---|
| 4,135,295 A | | 1/1979 | Price |
| 4,184,933 A | | 1/1980 | Morcom et al. |
| 4,198,744 A | * | 4/1980 | Nicolay ........................ 438/132 |
| 4,598,462 A | | 7/1986 | Chandrasekhar |
| 5,311,039 A | * | 5/1994 | Kimura et al. ................. 257/50 |
| 5,389,814 A | * | 2/1995 | Srikrishnan et al. ......... 257/529 |
| 5,466,484 A | * | 11/1995 | Spraggins et al. ........... 438/132 |
| 5,614,440 A | | 3/1997 | Bezama et al. |
| 5,698,456 A | | 12/1997 | Bryant et al. |
| 5,708,291 A | | 1/1998 | Bohr et al. |
| 5,789,970 A | | 8/1998 | Denham |
| 5,854,510 A | | 12/1998 | Sur, Jr. et al. |
| 5,872,390 A | | 2/1999 | Lee et al. |
| 5,899,736 A | | 5/1999 | Weigand et al. |
| 5,963,825 A | * | 10/1999 | Lee et al. .................... 438/601 |
| 6,258,700 B1 | * | 7/2001 | Bohr et al. .................. 438/467 |

OTHER PUBLICATIONS

IBM Technical Disclosure Bulletin; Pub No. 1, Jun. 1991 "Improved Silicide Fuses for VLSI Circuits".

* cited by examiner

*Primary Examiner*—John F. Niebling
*Assistant Examiner*—Jennifer M. Kennedy
(74) *Attorney, Agent, or Firm*—Eric W. Petraske; Cantor Colburn LLP

(57) ABSTRACT

Described herein is a fuse incorporating a covering layer disposed on a conductive layer, which is disposed on a polysilicon layer. The covering layer preferably comprises a relatively inert material, such as a nitride etchant barrier. The covering layer preferably has a region of relatively less-inert filler material. Upon programming of the fuse, the conductive layer, which can be a silicide, preferentially degrades in the region underlying the filler material of the covering layer. This preferential degradation results in a predictable "blowing" of the fuse in the fuse region underlying the filler material. Since the "blow" area is predictable, damage to adjacent structures can be minimized or eliminated.

16 Claims, 15 Drawing Sheets

ENHANCED EFUSES BY THE LOCAL DEGRADATION OF THE FUSE LINK

BACKGROUND OF THE INVENTION

The present invention relates generally to fuses on integrated circuit boards and specifically to fuses with controlled and predictable areas of degradation.

Redundancy in integrated circuit memories is part of the current chip manufacturing strategy to improve yield. By replacing defective cells with duplicate or redundant circuits on chips, integrated circuit memory yields are significantly increased. The current practice is to cut or blow conductive connections (fuses), thereby allowing the redundant memory cells to be used in place of nonfunctional cells. In the manufacture of integrated circuits, it is also common practice to provide for customization of chips and modules to adapt chips to specific applications. By selectively blowing fuses within an integrated circuit having multiple potential uses, a single integrated circuit design may be economically manufactured and adapted to a variety of custom uses.

Typically, fuses or fusible links are incorporated in the integrated circuit design, and these fuses are selectively blown, for example, by passing an electrical current of sufficient magnitude to cause them to open. Alternatively, a current that is weaker than the current required to entirely blow the fuse can be applied to the fuse in order to degrade the fuse and increase the resistance through the fuse. The process of selectively blowing or degrading fuses is often referred to as "programming." An alternative to blowing fuse links with a current is to open a window above each fuse to be broken, use a laser to blow the fuses, and then fill the windows with a passivation layer.

FIGS. 1a through 1c show a conventional fuse generally at 10. FIGS. 1a and 1b show a top plan view and a cross section, respectively, of a conventional fuse prior to programming. FIG. 1c shows the same cross section shown in FIG. 1b after the fuse has been programed. The fuse comprises two contacts 16 in electrical contact with a conducting silicide layer 14, which is disposed on a polysilicon layer 18. The fuse is generally covered with an insulative passivation layer (not shown). The silicide layer 14 and the polysilicon layer 18 are arranged in a stack, which is disposed on an insulative layer 12. The insulative layer 12 is typically an oxide layer, which itself has been deposited or grown on a substrate 20. The substrate 20 is typically monocrystalline silicon.

Referring now to FIG. 1b, current flowing through the fuse will generally proceed from one contact 16, through the silicide layer 14, to the other contact 16. If the current is increased to a level that exceeds the threshold current value of the fuse, the silicide layer 14 will melt, effectively opening the circuit. The resulting "blown" fuse is shown in FIG. 1c. The melted silicide forms agglomerations 24 on either side of a discontinuity 22. The fuse shown in FIGS. 1a through 1c can be modified by altering the characteristics of the underlying polysilicon layer 18. If the polysilicon layer 18 is heavily doped, for example, it can then serve as a higher resistance path through which current will flow after a discontinuity 22 is created in the silicide layer 14.

The fuse design described above, however, does not allow for reliable localization of the discontinuity 22 in the silicide layer 14. Since the process of melting the silicide layer 14 generates significant and potentially damaging heat, it is desirable to reduce the area in which the discontinuity 22 is potentially formed, to reduce the energy required to program the fuse, or to otherwise reduce the potential for damage to adjacent components when the fuse is programed. Attempts to localize the discontinuity 22 to a predefined region of the silicide layer 14 have included narrowing regions of the silicide to form a narrowed region (forming a "neck"). Alternatively, conventional attempts to minimize damage have included the physical isolation or containment of the fuse within the integrated circuit.

Conventional fuse designs, however, have not eliminated the unwanted damage caused by blowing a fuse, or have added cost or undesirable design qualities to the final product. What is needed in the art is a fuse that is fabricated such that programming of the fuse will result in reproducible degrading and melting of the silicide layer 14 at a defined point between the contacts 16 using less energy than conventional techniques.

BRIEF SUMMARY OF THE INVENTION

The above-described and other disadvantages of the prior art are overcome or alleviated by the fuse structure of the present invention, which comprises a polysilicon layer, a conductive layer disposed on the polysilicon layer, and a covering layer disposed on the conductive layer, wherein the covering layer comprises a first material and a region of filler material comprising a filler material disposed in the first material, and wherein the filler material is in contact with the conductive layer.

The present invention is also a method for making the above-described fuse. The process entails forming a polysilicon layer, forming a conductive layer on the polysilicon layer, forming a covering layer on the conductive layer, wherein the covering layer comprises a first material, and masking with a first photoresist, patterning, and etching to define a stack comprising the polysilicon layer, the conductive layer, and the covering layer. The stack is then masked with a second photoresist, patterned, and etched to define a gap in the covering layer. Then, the gap is filled with a filler material to form a region of filler material, wherein the region of filler material is in contact with the conductive layer.

The above-described and other features and advantages of the present invention will be appreciated and understood by those skilled in the art from the following detailed description, drawings, and appended claims.

BRIEF DESCRIPTION OF THE DRAWINGS

The device and method of the present invention will now be described by way of example only, with reference to the accompanying drawings, which are meant to be exemplary, not limiting, and wherein like elements are numbered alike in several FIGURES, in which:

FIG. 1b is cross section A–A' of the fuse of FIG. 1a;

DETAILED DESCRIPTION OF THE INVENTION

Described herein is a fuse for use in electronic circuits. The fuse comprises a conductive layer disposed on a polysilicon layer, and a covering layer preferably comprising a first, relatively inert material with a region of filler material comprising a filler material disposed therein. Two contacts can be disposed in electrical contact with the conductive layer of the fuse. When the fuse is programed by passing a sufficient current through the conductive layer, the conductive layer preferentially degrades and melts in the region underlying the region of filler material of the covering layer. This localized degradation occurs both because the conductive layer has been physically stressed by selective removal of the covering layer, and because the conductive layer degradation is enhanced under the filler material, which, in a preferred embodiment, is less-inert than the first, relatively inert material of the covering layer. The conductive layer is thereby degraded at a point directly below the filler material of the covering layer.

Figure 1A:
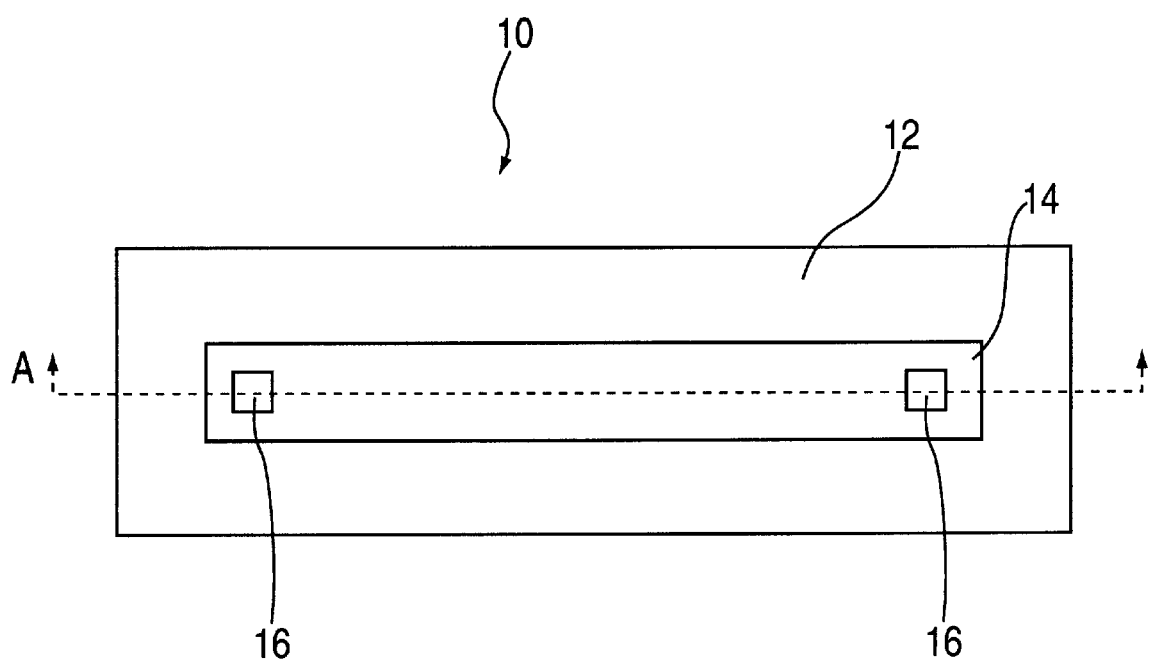
FIG. 1a is a plan view of a conventional fuse.
Figure 1B:
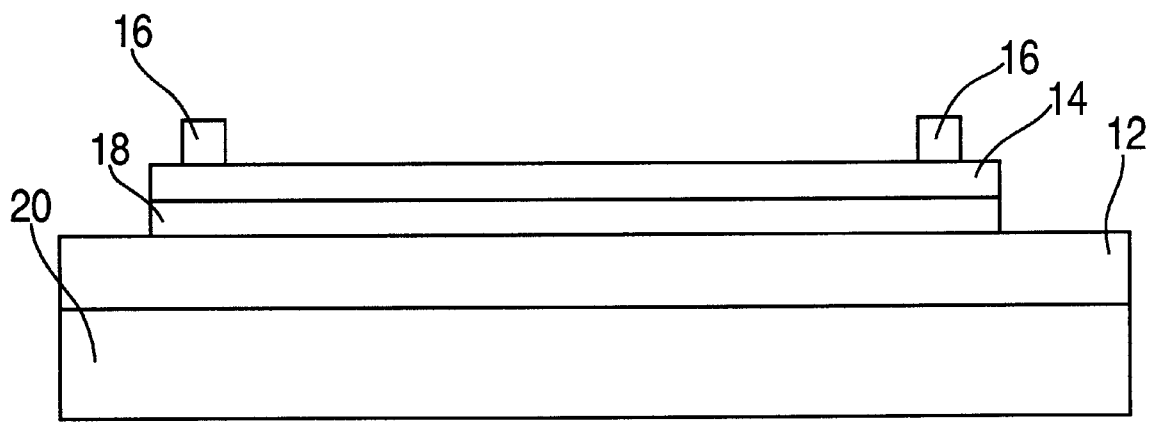
Figure 1C:
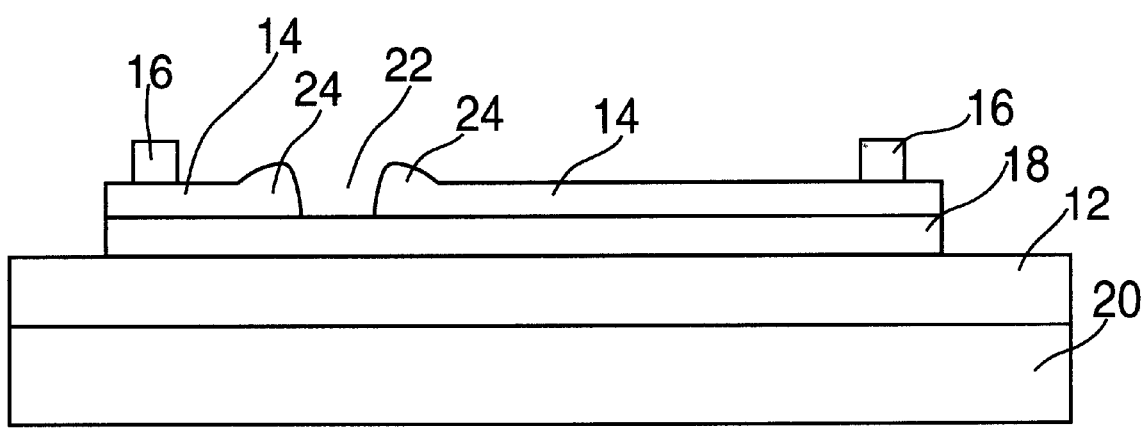
FIG. 1c is the cross section shown in FIG. 1b after the fuse has been programed.
Figure 2:
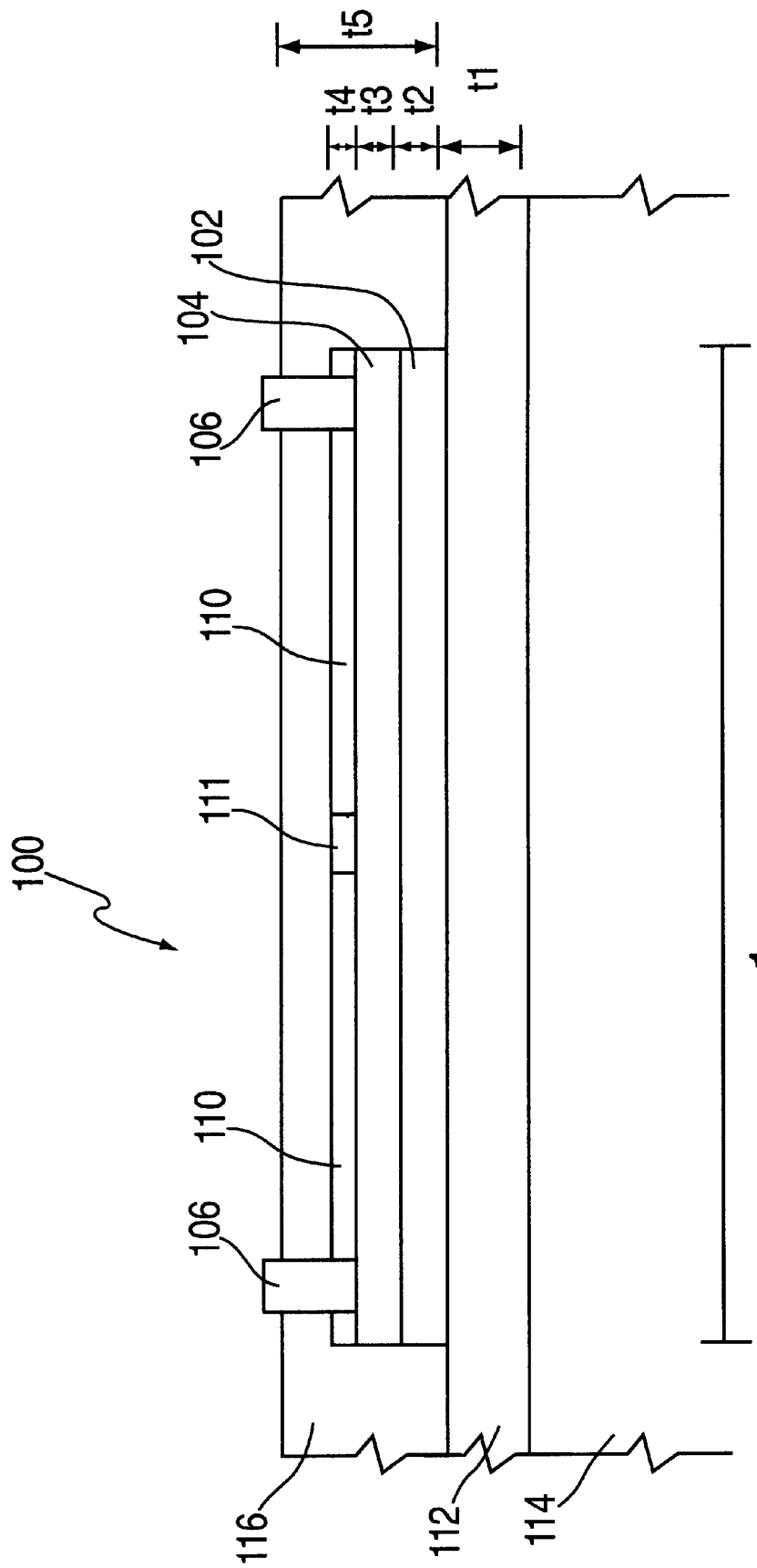
FIG. 2 is a cross section of one embodiment of the fuse of the present invention, showing the incorporation of a filler material within a covering layer.

FIG. 2 shows a cross section of one embodiment of the fuse of the present invention located on a substrate and insulator and encased in a passivation layer generally at 100. The relative thicknesses of the layers shown in FIG. 2 and subsequent figures are not necessarily drawn to scale, and are for illustrative purposes only. The fuse structure can be formed on any conventional device substrate, and preferably is formed on an oxide layer 112 which has been formed on a substrate layer 114. The oxide layer 112, which can be silicon dioxide or other conventional oxides and insulators known in the art, has a thickness sufficient to electrically insulate the fuse. The oxide layer 112 has a thickness "t1" of about 2500 to about 4500 angstroms (Å) in one embodiment, and can be formed via thermal oxidation of the underlying substrate layer 114, or other techniques well know in the art. The substrate layer 114 can be, among other conventional substrates, monocrystalline silicon. The fuse structure, with the exception of the contacts 106, is encased in an insulative passivation layer 116, which can be, among other conventional materials, silicon dioxide. The passivation layer 116 is formed with a thickness "t5" sufficient to encapsulate a polysilicon layer 102, a conductive layer 104, and a covering layer 110, and to protect the fuse from electrical or mechanical damage.

Figure 3A:
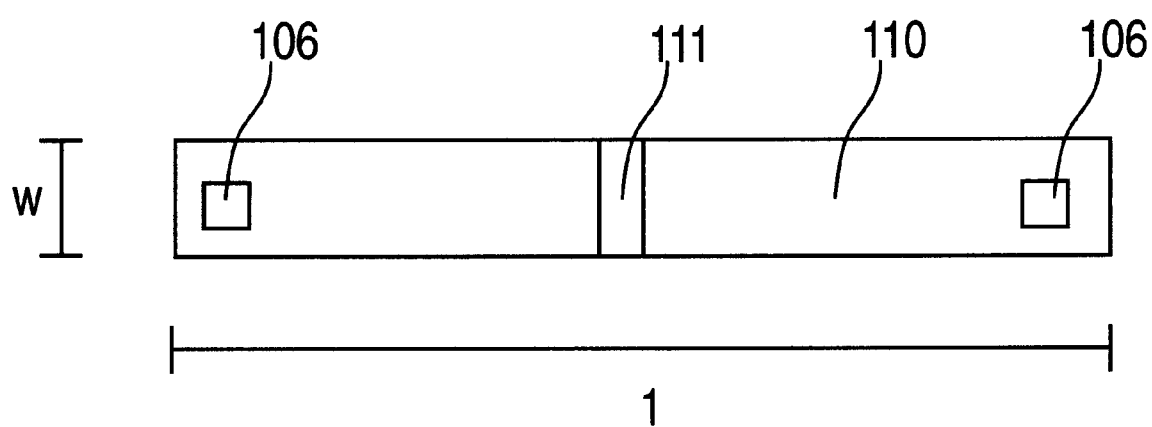
FIG. 3a is a partial plan view of the fuse of FIG. 2.

The fuse itself comprises the polysilicon layer 102, which is disposed on the oxide layer 112, a conductive layer 104, which is disposed on the polysilicon layer 102, and a covering layer 110, which is disposed on the conductive layer 104. A region of filler material 111 is disposed within the covering layer 110. Two contacts 106 are preferably disposed in electrical communication with the conductive layer 104 of the fuse to provide direct external electrical access to the fuse if such access is desired. FIG. 3a shows a plan view of the fuse of FIG. 2 with the passivation layer 116, oxide layer 112, and the substrate layer 114 removed for clarity. As shown in FIGS. 2 and 3a, the polysilicon layer 102, the conductive layer 104, and the covering layer 110 are formed in a stack, and therefore, in one embodiment, have the same width "w" and length "1" as each other.

In one embodiment in which the polysilicon layer 102, the conductive layer 104, and the covering layer 110 each have approximately the same width "w" and length "1", a width "w" as small as the lower limit of the process technology is preferred. For example, the polysilicon layer 102, the conductive layer 104, and the covering layer 110 can have a width "w" of less than 0.50 microns, with a width "w" of less than 0.20 microns preferred. The length "1" of the polysilicon layer 102, the conductive layer 104, and the covering layer 110 is, in one embodiment, between three and fifty times the width "w," with a length "1" between about five to about ten times the width "w" preferred, although the length "1" can be increased significantly more, depending on the application.

The shape of the polysilicon layer 102, the conductive layer 104, and the covering layer 110, as seen in the overhead view shown in FIG. 3a, can be any shape suitable for providing the desired electrical connections through the contacts 106, while at the same time providing sufficient space for the region of filler material 111 in the covering layer 110. Examples include, but are not limited to, shapes having enlarged areas around the contacts 106, and shapes that taper from the areas around the contacts 106 to the area between the contacts 106. Those with skill in the art will realize that many more shapes are possible and are within the spirit and scope of this invention.

The polysilicon layer 102 is formed on the oxide layer 112 and can have any thickness suitable to support the conductive layer 104, depending upon the application, with a thickness "t2" of about 2,000 Å (angstroms) to about 3,000 Å preferred, and a thickness of about 2,300 Å to about 2,700 Å especially preferred. The polysilicon layer 102 can have p-type doping, n-type doping, or no doping, with a sheet resistance sufficient to prevent unwanted current flow after programming of the fuse. A resistance of greater than about 100 ohms per square is preferred, with greater than about 500 ohms per square especially preferred.

The conductive layer 104 is formed on the polysilicon layer 102. The conductive layer 104 can be any material that has sufficiently low resistance, that is compatible with the fuse environment, and that can be formed on the polysilicon layer 102 during processing. The conductive layer 104 can be a metal silicide, such as cobalt silicide, titanium silicide, tungsten silicide, tantalum silicide, and platinum silicide, including material comprising at least one of the foregoing, and the like, among others, with cobalt silicide, tungsten silicide, and titanium silicide preferred. The conductive layer 104 has a thickness "t3" sufficient to provide a conductive pathway, while not requiring an excessive current to program. In one embodiment, the conductive layer 104 is metal silicide, such as cobalt silicide, having a thickness "t3" of about 200 Å to about 300 Å, with a thickness of about 225 Å to about 275 Å preferred, and a sheet resistance of less than about 15 ohms per square, with a sheet resistance of less than about 10 ohms per square preferred.

The covering layer 110 comprises a first material that can be any conventional material that can support the underlying conductive layer 104, and that will create localized stress concentrations in the underlying conductive layer 104 when sufficiently etched during processing. The first material of the covering layer 110 is preferably supportive, because the removal of the support from the conductive layer 110 in a localized area of the covering layer 110 creates the stress concentrations in the underlying conductive layer 104. The stress concentrations thereby created lead to a preferential degradation of the conductive layer 104 at the stress concentrations.

Further, the covering layer 110 preferably comprises a relatively inert material as the first material. The first material used for the covering layer 110 is preferably relatively inert because, if a relatively less-inert material is later used in the region of filler material 111, then the relatively less-inert filler material will increase the rate of degradation in the region of the conductive layer 110 underlying the region of filler material 111 relative to the rate of degradation of the remainder of the conductive layer 104, which underlies the relatively inert, first material of the covering layer 110. The covering layer 110 first material can comprise a nitride, such as is normally deposited as an etchant barrier during conventional chip fabrication.

The region of filler material 111 of the covering layer 110 can comprise any conventional material that can fill an etched gap in the covering layer 110 and cover the conductive layer 104. Preferably, as discussed above, the region of filler material 111 comprises a filler material that is less-inert than the relatively inert first material used to form the covering layer 110. For example, the filler material can comprise Silicon Low K ("SILK"), a material comprising relatively loosely bound oxygen or nitrogen, silicon dioxide, silicon oxynitride, spin on glass materials, silicates, and flourosilicates among others, and combinations including at least one of the foregoing.

Figure 3B:
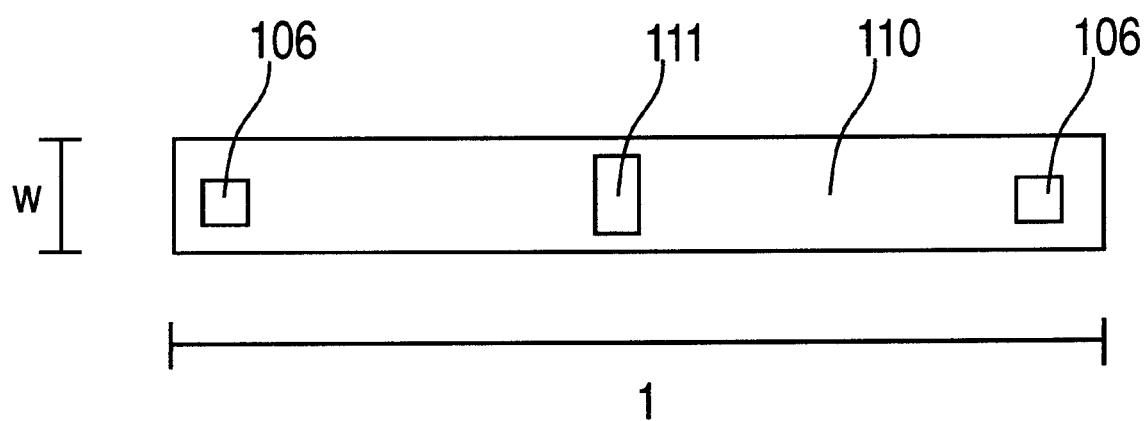
FIG. 3b is a partial plan view showing an alternative embodiment of the filler material of the covering layer.

The covering layer 110 has a thickness "t4" that is sufficient to allow the region of filler material 111 to differentially alter the resistance of the underlying conductive layer 104 during programing. For example, in one embodiment the covering layer 110 comprises a nitride etchant barrier as the first material, and the covering layer 110 has a thickness of about 200 Å to about 400 Å, with a thickness "t4" of about 250 Å to about 350 Å preferred. The region of filler material 111 of the covering layer 110 can have a thickness that is different from the remainder of the covering layer 110, with, in one embodiment, substantially similar thicknesses preferred. Further, the region of filler material 111 can extend across the width "w" of the covering layer 110 as shown in FIG. 3a, or it can be disposed within the covering layer, as shown in FIG. 3b. The region of filler material 111 can be formed in any shape, two of which are seen in FIGS. 3a and 3b, with a substantially rectangular shape preferred. Further, the region of filler material 111 can be formed at any location along the length "1" of the covering layer 110 between the contacts, with a location approximately central to the layer (as shown in FIGS. 3a and 3b) preferred.

The contacts 106 are disposed at opposite ends of the fuse, and are coupled to the conductive layer 104 in order to provide an electrical connection between the fuse and an external device, or between the fuse and other components in the same integrated circuit. The contacts 106 can be connected to metal interconnect lines so that the fuse can be accessed for programming. The contacts 106 can be formed from any conventional conducting material suitable for use in integrated circuits, such as tungsten. Alternatively, interconnect lines can be formed to directly contact the conductive layer 104, in which case the portions of the interconnect lines beneath the surface of the passivation layer 116 are the contacts 106.

Figure 4:
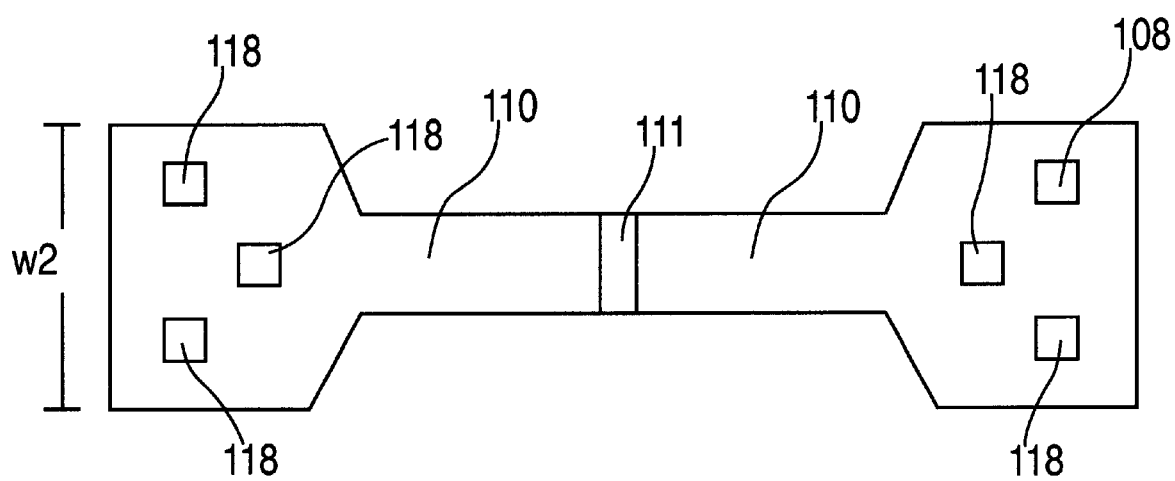
FIG. 4 is a plan view of one embodiment of the fuse of the present invention.

Although FIGS. 2, 3a, and 3b depict an embodiment of the fuse of the present invention in which two contacts 106 are provided, any number of contacts 106 can be provided at either end of the fuse in order to facilitate functionality or programing. FIG. 4 shows an alternative embodiment in which a plurality of contacts 118 are provided on a fuse. As shown in FIG. 4, the width "w2" has been increased at either end of the fuse to accommodate the plurality of contacts 118. The actual dimensions of the contact regions are not critical to the proper functioning of the fuse, and many alternatives can be implemented to meet the needs of any particular application.

Figure 5A:
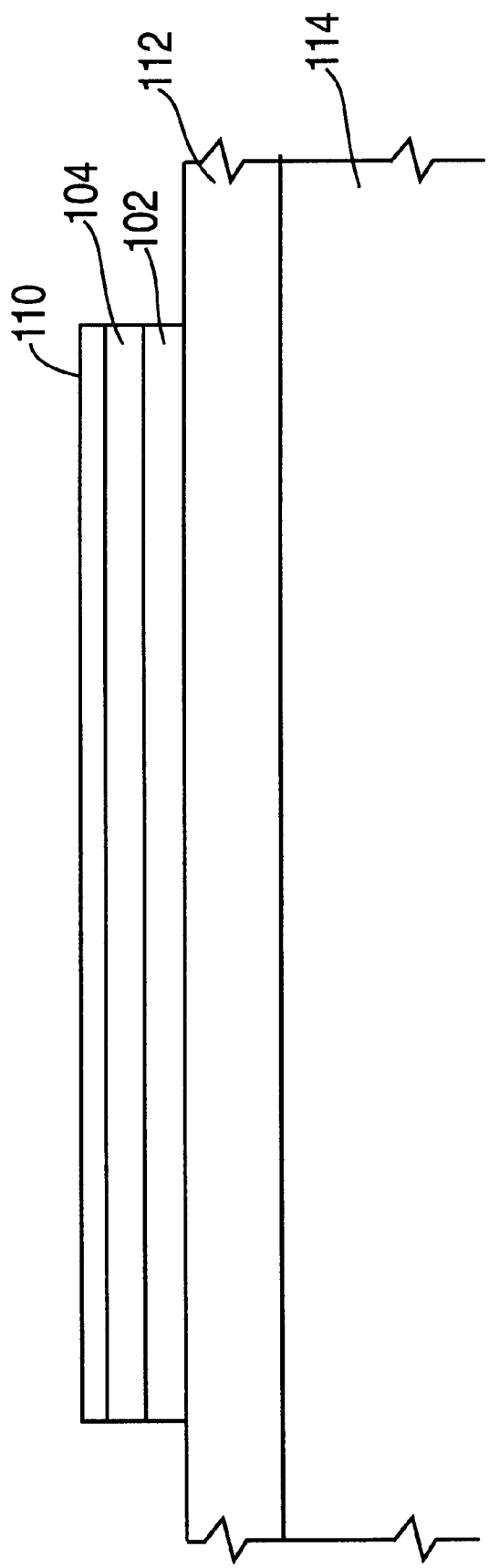
FIG. 5a is a cross section of a fuse precursor showing the formation of a stack.

FIGS. 5a through 5g illustrate one embodiment of the method by which the fuse described above can be fabricated. FIG. 5a is a cross section of a precursor of the fuse of one embodiment of the present invention after several preliminary fabrication steps have been performed. Specifically, the following steps or their equivalent have been performed using techniques well known in the art: the polysilicon layer 102 has been deposited on the oxide layer 112, the conductive layer 104 has been deposited on the polysilicon layer 102, the first material of the covering layer 110 has been deposited on the conductive layer 102, the resulting three layer stack has been covered with a first layer of photoresist (not shown), the photoresist patterned, the three layer stack etched, and the photoresist removed to result in the structure shown in FIG. 5a.

Figure 5B:
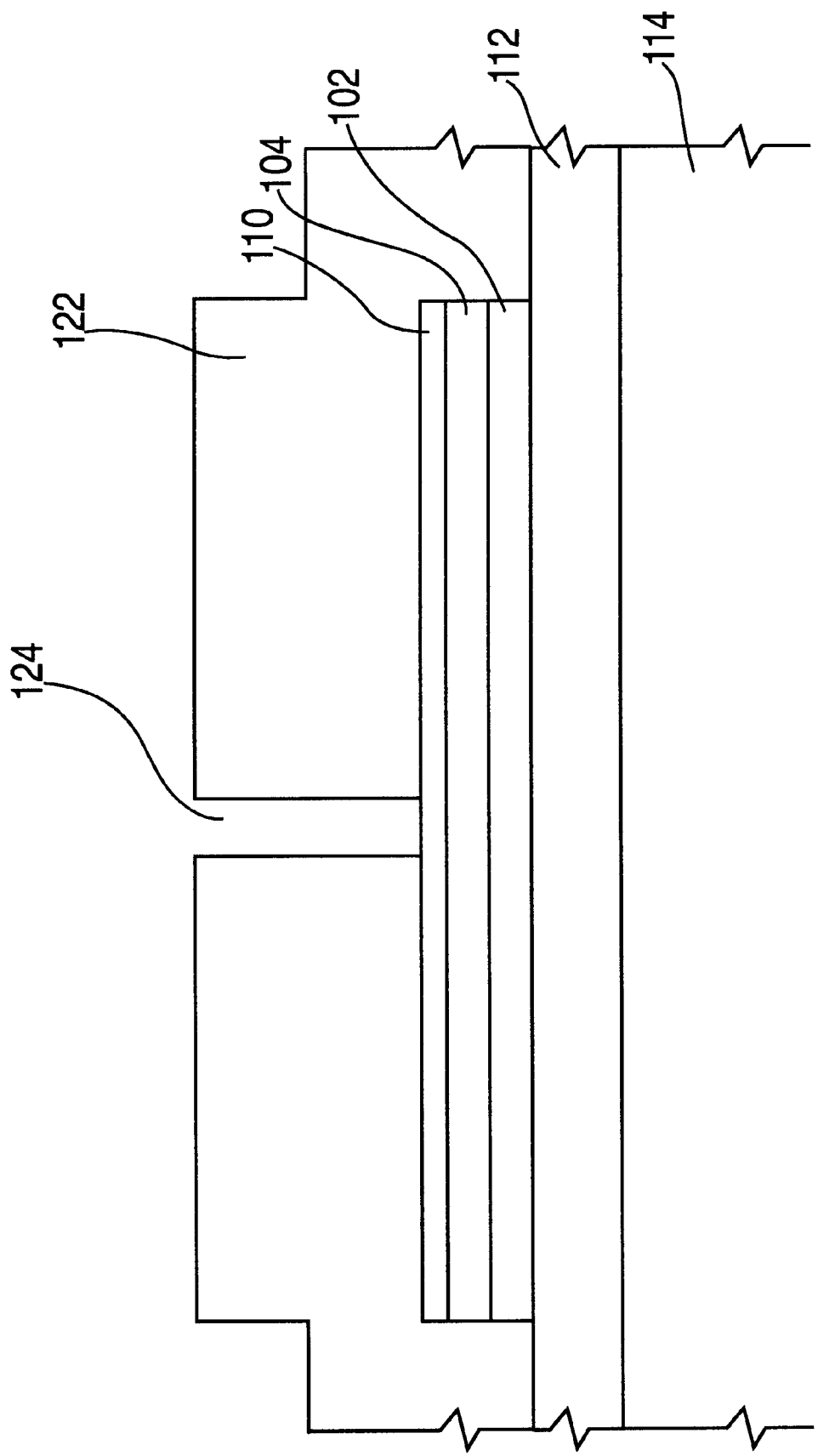
FIG. 5b is a cross section of a fuse precursor showing the formation and patterning of a mask layer.
Figure 5C:
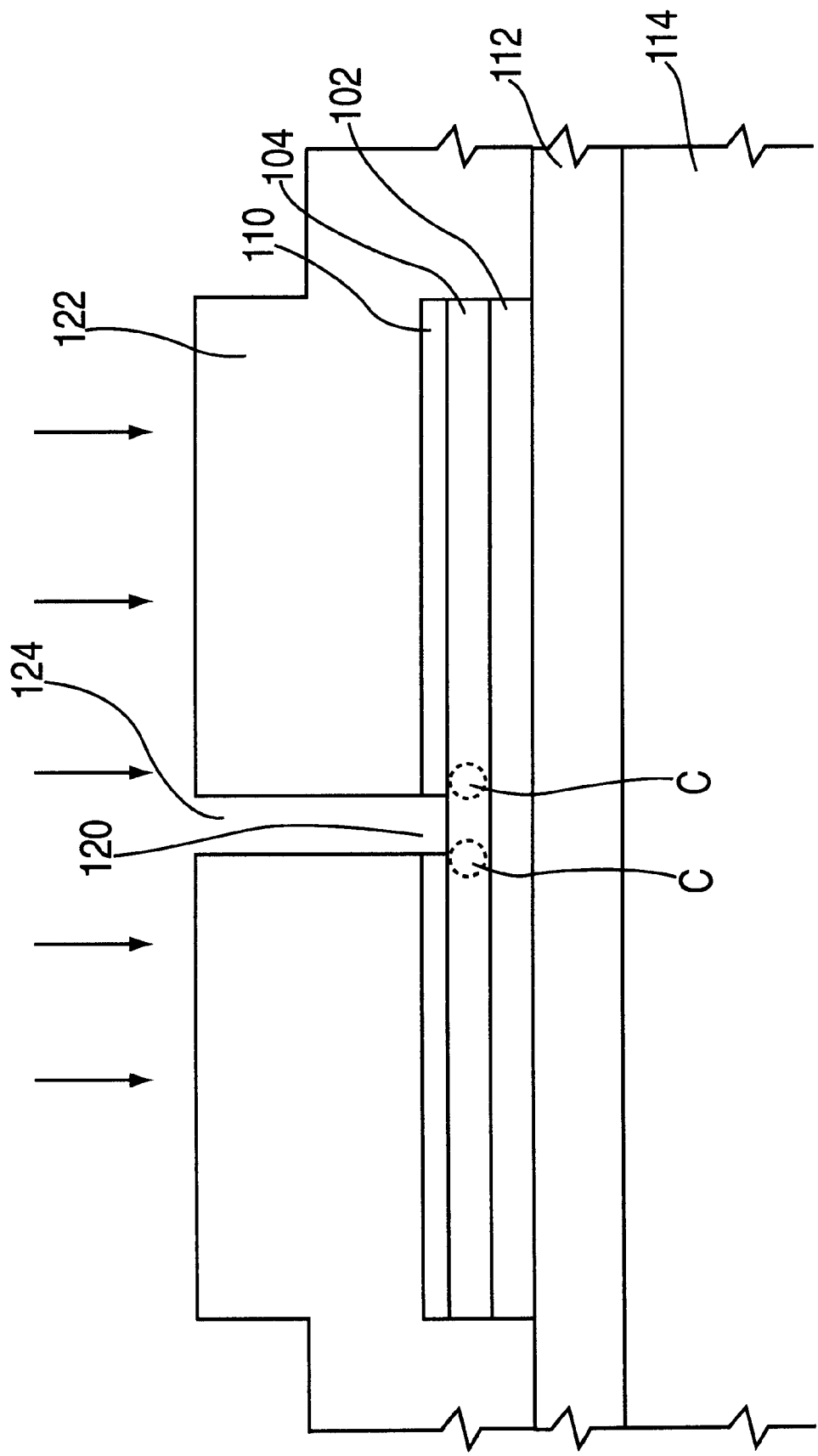
FIG. 5c is a cross section of a fuse precursor showing the etching of a region of the covering layer.

FIG. 5b shows the fuse precursor of FIG. 5a after a second layer of photoresist 122 has been formed and patterned to reveal a region of the covering layer 110 through a window 124 in the photoresist 122. FIG. 5c shows the fuse precursor of FIG. 5b undergoing an etching process, which can be any conventional etching technique, such as a reactive ion etch, to remove the exposed portion of the covering layer 110. After etching, a gap 120 is defined in the covering layer 110. Since the local support of the conductive layer 104 by the covering layer 110 has been removed in the region of the gap 120, the areas of the conductive layer 104 underlying the edges of the gap 120 have a stress concentration (shown by the circles labeled "C" in FIG. 5c).

As discussed above, the gap 120 can be filled with any suitable material, and preferably is filled with a filler material that is relatively less-inert than the first material previously deposited to form the covering layer 110. The gap 120 can be filled before or after the photoresist 122 is removed. Any application technique that does not damage the underlying conductive layer 104 can be used to form the region of filler material 111 in the gap 120. For example, SILK can be deposited though the window 124 of the photoresist 122 into the gap 120 in the covering layer 110 to form the region of filler material 111. In a preferred embodiment, the photoresist 122 is removed, and SILK is applied via methods well known in the art, such as spin-on techniques, to form the region of filler material 111.

Figure 5D:
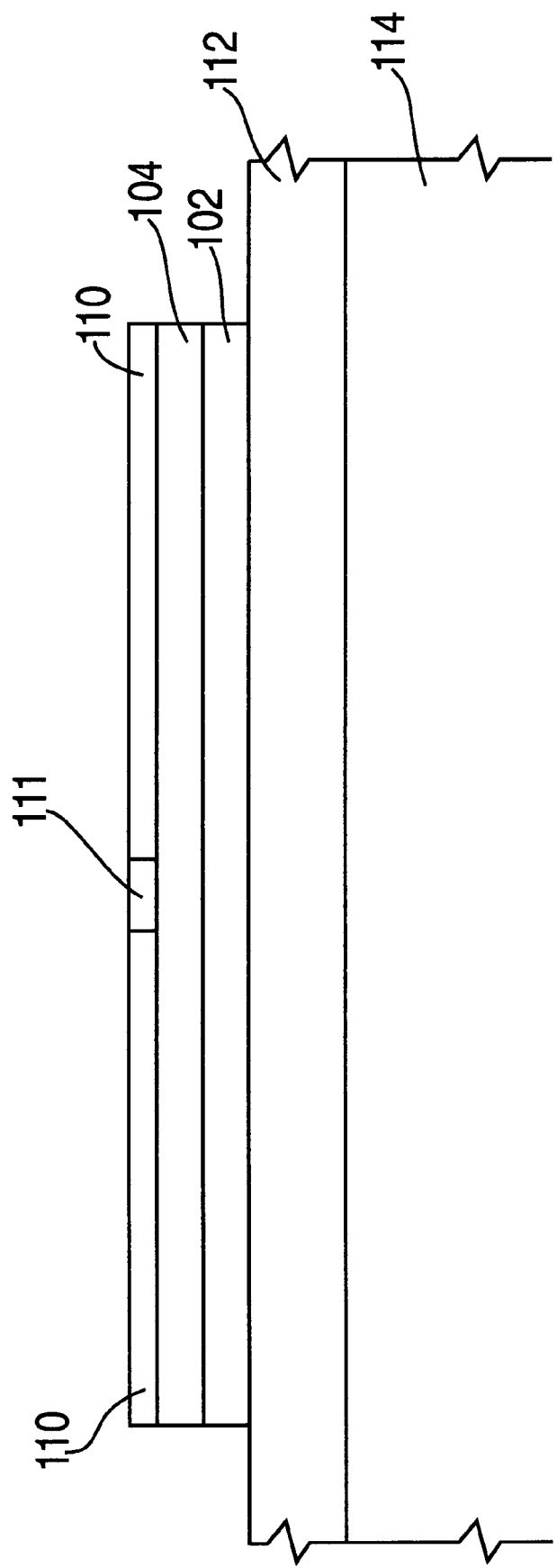
FIG. 5d is a cross section of a fuse precursor showing the formation of the filler material in the covering layer.
Figure 5E:
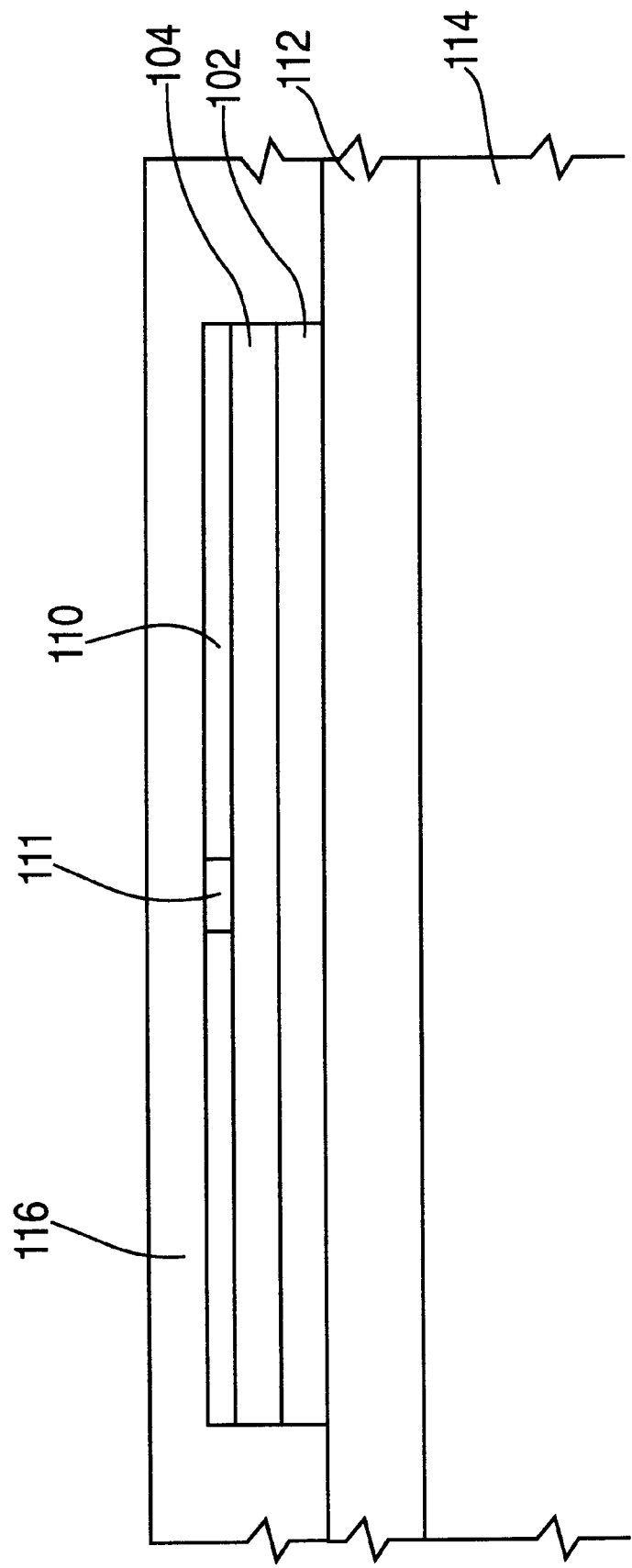
FIG. 5e is a cross section of a fuse precursor showing the formation of a passivation layer.
Figure 5F:
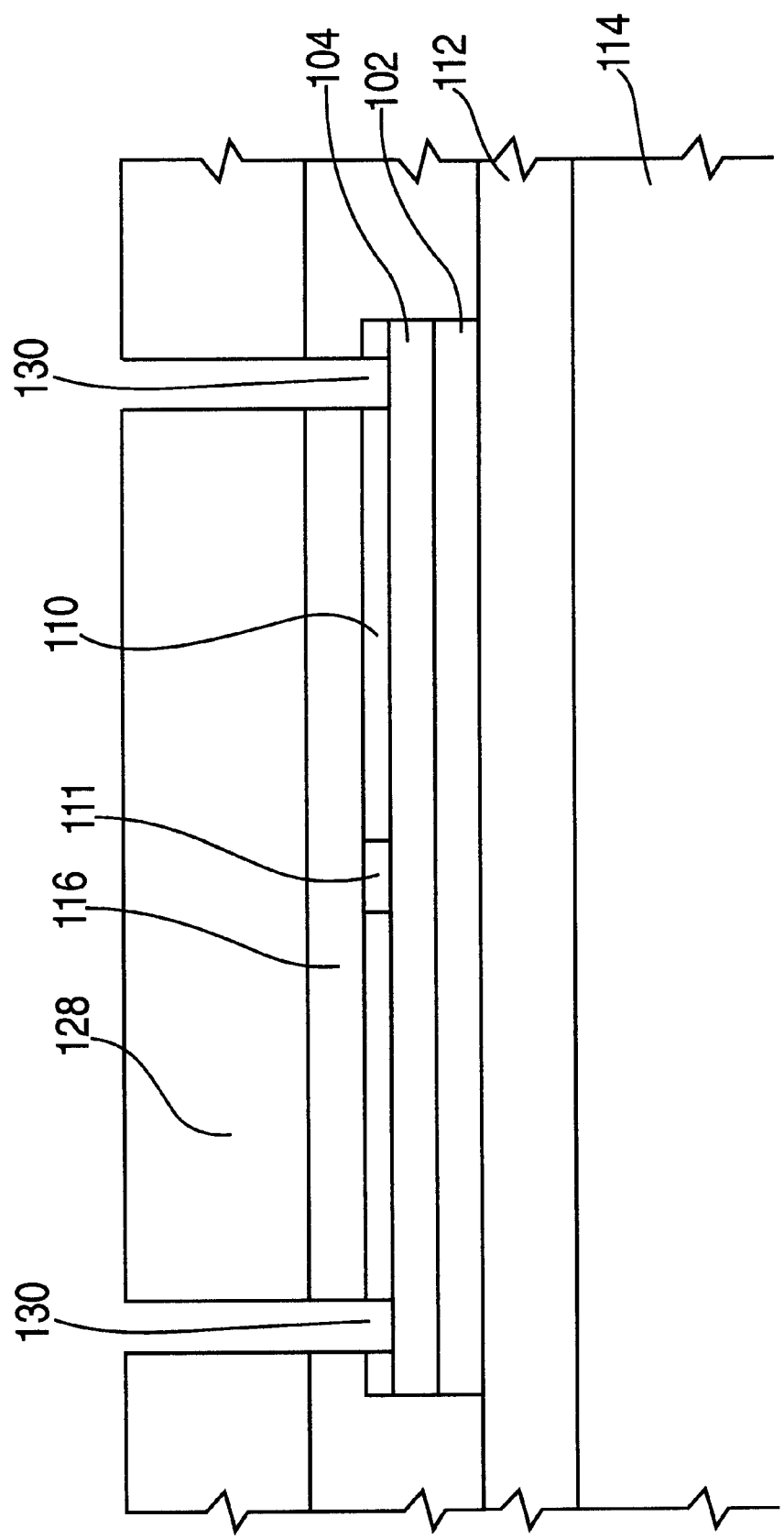
FIG. 5f is a cross section of a fuse precursor showing the precursor after etching of the passivation layer and covering layer to provide a space for the formation of contacts.
Figure 5G:
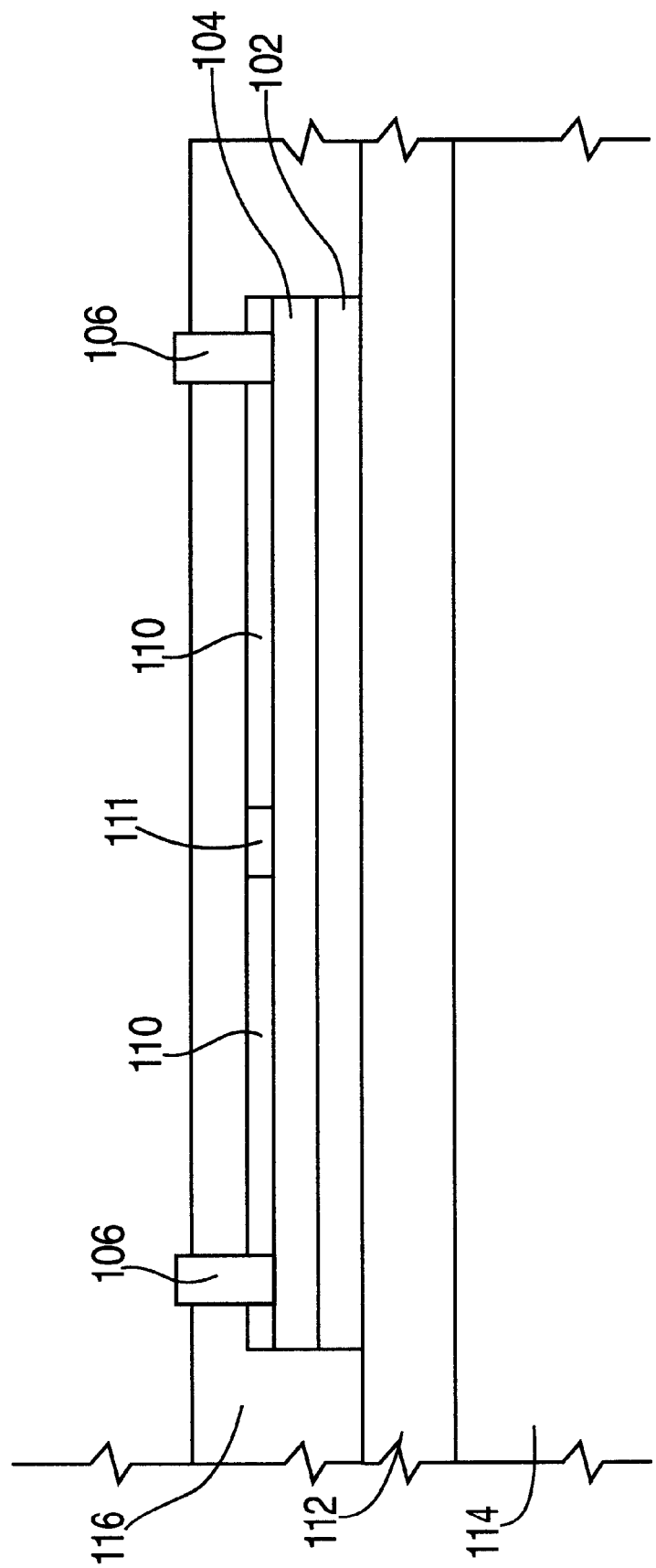
FIG. 5g is a cross section of one embodiment of the fuse of the present invention.

FIG. 5d shows the fuse precursor after formation of the region of filler material 111 and removal of the second layer of photoresist 122. FIG. 5e shows the precursor of FIG. 5d after formation of a passivation layer 116. FIG. 5f shows the fuse precursor after application and patterning of a third layer of photoresist 128 and etching of the passivation layer 116 and the covering layer 110 in the exposed regions to form contact areas 130. Formation of contacts 106 in the contact areas 130 is done using conventional techniques, and the third layer of photoresist 128 is removed to yield the final fuse embodiment as shown in FIG. 5g. When a sufficient programing current is passed through the conductive layer 104, the conductive layer 104 will degrade preferentially below the region of filler material 111, both because the support of the covering layer 110 was removed during the covering layer 110 etching step, and because the conductive layer 104 degrades more rapidly under the relatively less-inert filler material.

Figure 6:
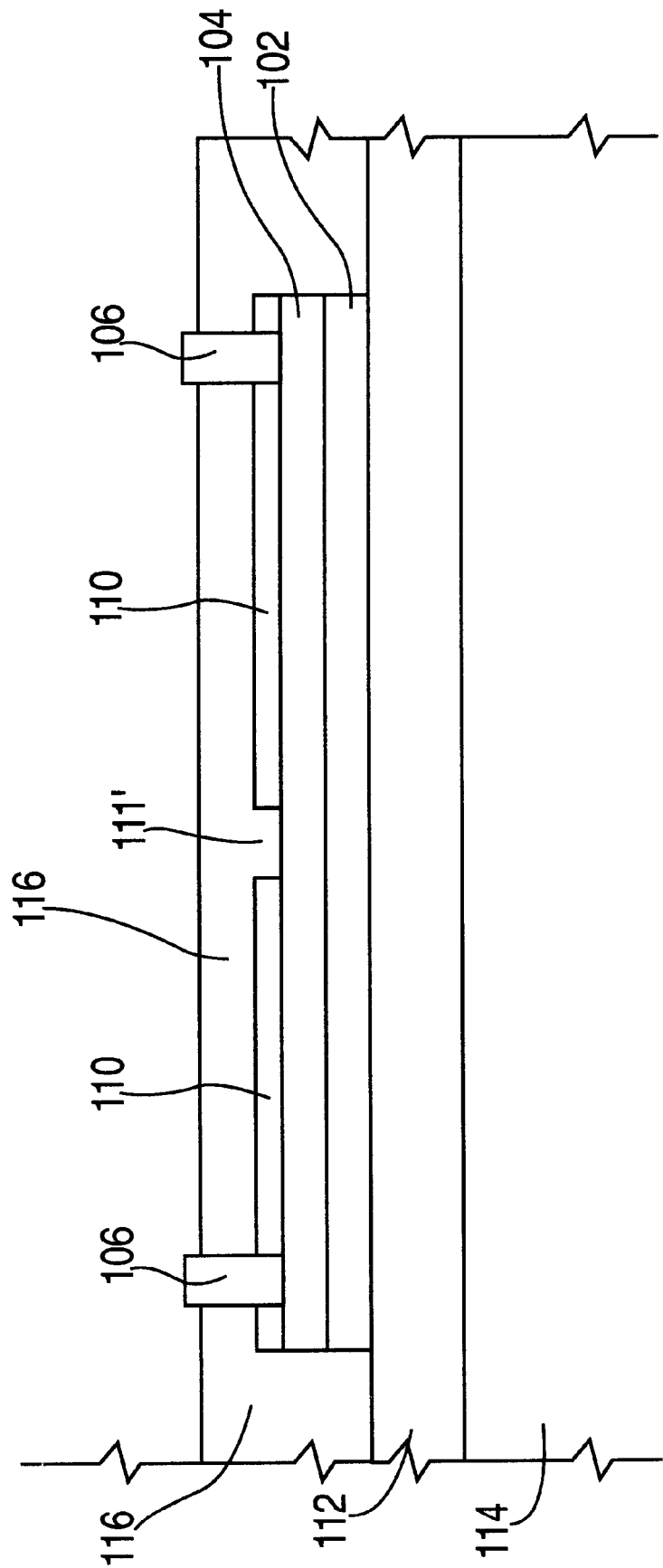
FIG. 6 is a cross section of another embodiment of the fuse of the present invention, wherein the filler material is formed during formation of a passivation layer.

In another embodiment of the fuse, the gap 120 formed in the covering layer 110 during etching can be left unfilled after etching, and, as shown in FIG. 6, filled in later with the material used to form the passivation layer 116 during formation of the passivation layer 116. In this case, the region of filler material 111' can be any conventional passivation material such as, silicon nitride, silicon dioxide, or combinations comprising at least one of the foregoing. In this embodiment, localization of the fuse blow region is achieved through the introduction of stress concentrations in the conductive layer 104 during etching of the covering layer, without the added effect of differential inert character between the covering layer 110 first material and the filler material in the region of filler material 111'. The fabrication and dimensions of this embodiment are as those given above for the prior embodiments.

The fuse of the present invention allows the incorporation into integrated circuits of fuses that "blow" in a predicable region using less energy, and thus are less likely to cause damage to adjacent structures and devices than conventional fuses. Further, the need to isolate the fuse structure is eliminated, and programming is more reliable, predictable, and efficient.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the appended claims.

What is claimed is:

1. A process for making a fuse, comprising:

forming a polysilicon layer;

forming a conductive layer on said polysilicon layer;

forming a covering layer on said conductive layer, wherein said covering layer comprises a first material;

masking with a first photoresist, patterning, and etching to define a stack comprising said polysilicon layer, said conductive layer, and said covering layer;

masking with a second photoresist, patterning, and etching to define a gap in said covering layer; and, filling said gap with a filler material to form a region of filler material, thereby creating the fuse, wherein said region of filler material is in contact with said conductive layer.

2. The process of claim 1, wherein said filler material is less inert than said first material.

3. The process of claim 2, wherein said conductive layer comprises a metal silicide, said first material comprises silicon nitride, and said filler material comprises SILK, silicon dioxide, silicon oxynitride, a spin on glass material, a silicate, or flourosilicate.

4. The process of claim 3, wherein said metal silicide comprises cobalt silicide, tungsten silicide, or titanium silicide.

5. The process of claim 1, wherein said region of filler material is formed centrally in said covering layer.

6. The process of claim 1, wherein said covering layer has a thickness of about 200 to about 400 angstroms.

7. The process of claim 6, wherein said covering layer has a thickness of about 250 to about 350 angstroms.

8. The process of claim 1, wherein said region of filler material extends through the entire thickness of said covering layer.

9. The process of claim 1, wherein said conductive layer has a thickness of about 200 to about 300 angstroms and a sheet resistance of less than about 15 ohms per square.

10. The process of claim 9, wherein said conductive layer has a thickness of about 225 to about 275 angstroms and a sheet resistance of less than about 10 ohms per square.

11. The process of claim 1, wherein said polysilicon layer has a thickness of about 2,000 to about 3,000 angstroms and a sheet resistance of greater than about 100 ohms.

12. The process of claim 11, wherein said polysilicon layer has a thickness of about 2,300 to about 2,700 angstroms and a sheet resistance of greater than about 500 ohms.

13. The process of claim 1, wherein said filler material is a material used for a passivation layer.

14. The process of claim 1, further comprising forming two contacts disposed in contact with said conductive layer after said filling said gap, wherein said region of filler material is disposed between said contacts.

15. The process of claim 1, wherein said filling of said gap occurs during formation of a passivation layer.

16. The process of claim 15, wherein said region of filler material comprises silicon dioxide, silicon nitride, or combinations comprising at least one of the foregoing.

* * * * *